(12) United States Patent
Suda

(10) Patent No.: US 7,800,390 B2
(45) Date of Patent: Sep. 21, 2010

(54) LOAD FLUCTUATION CORRECTION CIRCUIT, ELECTRONIC DEVICE, TESTING DEVICE, AND LOAD FLUCTUATION CORRECTION METHOD

(75) Inventor: Masakatsu Suda, Saitama (JP)

(73) Assignee: Advantest Corporation, Tokyo (JP)

( * ) Notice: Subject to any disclaimer, the term of this patent is extended or adjusted under 35 U.S.C. 154(b) by 45 days.

(21) Appl. No.: 12/370,614

(22) Filed: Feb. 13, 2009

(65) Prior Publication Data
US 2010/0039078 A1 Feb. 18, 2010

Related U.S. Application Data

(63) Continuation of application No. PCT/JP2007/064376, filed on Jul. 20, 2007.

(30) Foreign Application Priority Data
Aug. 16, 2006 (JP) ............................. 2006-221913

(51) Int. Cl.
*G01R 31/02* (2006.01)

(52) U.S. Cl. ..................... 324/763; 324/158.1; 327/535; 327/538; 327/540

(58) Field of Classification Search ................. 323/212, 323/299, 304; 324/158.1, 763, 765, 771; 327/235, 538, 540
See application file for complete search history.

(56) References Cited

U.S. PATENT DOCUMENTS

| | | | | |
|---|---|---|---|---|
| 5,914,631 A * | 6/1999 | Soneda | ......................... | 327/535 |
| 6,366,157 B1 * | 4/2002 | Abdesselem et al. | ......... | 327/535 |
| 6,414,527 B1 * | 7/2002 | Seno et al. | .................. | 327/158 |
| 6,667,651 B2 * | 12/2003 | Hashiguchi | .................. | 327/538 |
| 6,924,679 B2 * | 8/2005 | Seno et al. | ................... | 327/158 |
| 7,557,561 B2 * | 7/2009 | Awaji et al. | ............... | 324/76.77 |
| 7,714,600 B2 * | 5/2010 | Hasumi et al. | ............... | 324/763 |

FOREIGN PATENT DOCUMENTS

| | | |
|---|---|---|
| JP | 936708 | 2/1997 |
| JP | 1174768 | 3/1999 |
| JP | 2003124795 | 4/2003 |
| JP | 2003218689 | 7/2003 |
| JP | 2003258617 | 9/2003 |

* cited by examiner

*Primary Examiner*—Gary L Laxton
(74) *Attorney, Agent, or Firm*—Jianq Chyun IP Office

(57) ABSTRACT

Provided is a load fluctuation compensation circuit for compensating a power source voltage supplied to an operation circuit, the load fluctuation compensation circuit including: a periodic signal changing section that receives a power source voltage from a power source shared with the operation circuit, and outputs a changed signal resulting from changing a supplied periodic signal according to the power source voltage; a phase comparator that compares a phase of the periodic signal with a phase of the changed signal outputted from the periodic signal changing section; an initializing section that generates a bias voltage supplied to the periodic signal changing section and adjusts a phase difference between the periodic signal and the changed signal to a preset value, based on the comparison result of the phase comparator; a controller that holds the bias voltage outputted from the initializing section when the phase difference between the periodic signal and the changed signal has become the preset value; a power current consumption circuit that shares a power source with the operation circuit; and a fluctuation compensation section that controls an amount of a power current supplied to the power current consumption circuit, based on the comparison result outputted from the phase comparator while the bias voltage of the initializing section is kept on hold.

21 Claims, 11 Drawing Sheets

LOAD FLUCTUATION CORRECTION CIRCUIT, ELECTRONIC DEVICE, TESTING DEVICE, AND LOAD FLUCTUATION CORRECTION METHOD

CROSS REFERENCE TO RELATED APPLICATION

This is a continuation application of PCT/JP2007/64376 filed on Jul. 20, 2007 which claims priority from a Japanese Patent Application NO. 2006-221913 filed on Aug. 16, 2006, the contents of which are incorporated herein by reference.

BACKGROUND

1. Technical Field

The present invention relates to a load fluctuation compensation circuit, an electronic device, a test apparatus, and a load fluctuation compensation method. In particular, the present invention relates to a load fluctuation compensation circuit for compensating the power source voltage supplied to the operation circuit.

2. Related Art

Conventionally, in such components as an integrated circuit that includes a logic circuit configured by a CMOS or the like, the logic circuit is driven by a source power supplied from outside. For example, a power source metal interconnect layer formed in an integrated circuit chip is connected to an outside power source with bond wires or the like. Each logic circuit of the integrated circuit receives a source power by being connected with the power source metal interconnect layer. In other words, the logic circuits of an integrated circuit are driven by a common power source.

In such a configuration, the power source voltage supplied to each logic circuit depends on the driving state of the other logic circuits. This is detailed as follows. The power source current consumed by one logic circuit fluctuates depending on the driving state of the logic circuit. However, the logic circuit receives a source power via the bond wires or the metal interconnect as stated above. Therefore, when the power source current consumed by the other logic circuits fluctuates, the resultant resistance component changes the power source voltage supplied to the logic circuit accordingly.

A logic circuit is subjected to a load fluctuation and so the power source voltage fluctuates as the power current fluctuates. However, the conventional technology only enables fluctuation compensation of a relatively low frequency, and is often not adapted to compensate the fluctuation of the power source voltage in the above-stated case.

A balance circuit has already been known to reduce the stated fluctuation of the power source voltage, by balancing the entire power source current consumption by a circuit to be constant (e.g. Patent Document 1: Japanese Patent Application Publication No. 11-74768, page 4, FIG. 1). The disclosed balance circuit detects the time in which a pulse passes through a logic circuit, calculates the power current consumed by the logic circuit based on the detected time, and consumes a dummy current that yields a substantially constant summation when added together with the calculated consumption current.

However, the conventional balance circuit has to use a multiple of elements for detecting the time in which a pulse passes and calculating a power current consumed by a logic circuit, and so requires a large circuitry size which tends to increase the entire power current consumed by a circuit.

In view of the above, as an aspect, it is an advantage of the present invention to provide a load fluctuation compensation circuit,. an electronic device, a test apparatus, and a load fluctuation compensation method, which are able to solve the above-stated problems. This advantage is achieved by combinations of the features described in the independent claims. The dependent claims further define advantageous concrete examples of the present invention.

SUMMARY

Therefore, it is an object of an aspect of the innovations herein to provide a load fluctuation compensation circuit, an electronic device, a test apparatus, and a load fluctuation compensation method, which are able to solve the above-stated problems. This advantage is achieved by combinations of the features described in the independent claims. The dependent claims further define advantageous concrete examples of the present invention.

According to an aspect related to the innovations herein, provided is an exemplary load fluctuation compensation circuit for compensating a power source voltage supplied to an operation circuit, the load fluctuation compensation circuit including: a periodic signal changing section that receives a power source voltage from a power source shared with the operation circuit, and outputs a changed signal resulting from changing a supplied periodic signal according to the power source voltage; a phase comparator that compares a phase of the periodic signal with a phase of the changed signal outputted from the periodic signal changing section; an initializing section that generates a bias voltage supplied to the periodic signal changing section and adjusts a phase difference between the periodic signal and the changed signal to a preset value, based on the comparison result of the phase comparator; a controller that holds the bias voltage outputted from the initializing section when the phase difference between the periodic signal and the changed signal has become the preset value; a power current consumption circuit that shares a power source with the operation circuit; and a fluctuation compensation section that controls an amount of a power current supplied to the power current consumption circuit, based on the comparison result outputted from the phase comparator while the bias voltage of the initializing section is kept on hold. The periodic signal changing section may include a delay circuit, and output a delayed signal resulting from delaying the periodic signal by a delay amount corresponding to the power source voltage. The periodic signal changing section may include an oscillator circuit, and output an oscillation signal resulting from converting the periodic signal into a frequency corresponding to the power source voltage.

According to an aspect related to the innovations herein, provided is an exemplary electronic device having an operation circuit, the electronic device including: a source power supply line via which a source power is supplied to the operation circuit; and a load fluctuation compensation circuit for compensating a power source voltage supplied to the operation circuit via the source power supply line, where the load fluctuation compensation circuit includes: a periodic signal changing section that receives a power source voltage from a power source shared with the operation circuit, and outputs a changed signal resulting from changing a supplied periodic signal according to the power source voltage; a phase comparator that compares a phase of the periodic signal with a phase of the changed signal outputted from the periodic signal changing section; an initializing section that generates a bias voltage supplied to the periodic signal changing section and adjusts a phase difference between the periodic signal and the changed signal to a preset value, based on the comparison result of the phase comparator; a controller that holds the bias voltage outputted from the initializing section when the phase difference between the periodic signal and the changed signal has become the preset value; a power current consumption circuit that shares a power source with the operation circuit; and a fluctuation compensation section that controls an amount of a power current supplied to the power current consumption circuit, based on the comparison result outputted from the phase comparator while the bias voltage of the initializing section is kept on hold. The periodic signal changing section may include a delay circuit, and output a delayed signal resulting from delaying the periodic signal by a delay amount corresponding to the power source voltage. The periodic signal changing section may include an oscillator circuit, and output an oscillation signal resulting from converting the periodic signal into a frequency corresponding to the power source voltage.

According to an aspect related to the innovations herein, provided is an exemplary test apparatus for testing a device under test, the test apparatus including: a pattern generator that generates a test pattern for testing the device under test; a waveform shaping section that generates a test signal to be supplied to the device under test, based on the test pattern; a timing generator circuit that generates a timing signal for specifying a phase of the test signal, and supplies the generated timing signal to the waveform shaping section; and a determining section that determines whether the device under test is defective or not, based on an output signal from the device under test, where the timing generator circuit includes: a variable delay circuit that generates the timing signal by delaying each pulse of a supplied reference clock; a power source that supplies a power source voltage for driving the variable delay circuit, to the variable delay circuit; and a load fluctuation compensation circuit that compensates the power source voltage supplied to the variable delay circuit, and the load fluctuation compensation circuit includes: a periodic signal changing section that receives a power source voltage from a power source shared with the operation circuit, and outputs a changed signal resulting from changing a supplied periodic signal according to the power source voltage; a phase comparator that compares a phase of the periodic signal with a phase of the changed signal outputted from the periodic signal changing section; an initializing section that generates a bias voltage supplied to the periodic signal changing section and adjusts a phase difference between the periodic signal and the changed signal to a preset value, based on the comparison result of the phase comparator; a controller that holds the bias voltage outputted from the initializing section when the phase difference between the periodic signal and the changed signal has become the preset value; a power current consumption circuit that shares a power source with the operation circuit; and a fluctuation compensation section that controls an amount of a power current supplied to the power current consumption circuit, based on the comparison result outputted from the phase comparator while the bias voltage of the initializing section is kept on hold. The periodic signal changing section may include a delay circuit, and output a delayed signal resulting from delaying the periodic signal by a delay amount corresponding to the power source voltage. The periodic signal changing section may include an oscillator circuit, and output an oscillation signal resulting from converting the periodic signal into a frequency corresponding to the power source voltage.

According to an aspect related to the innovations herein, provided is an exemplary load fluctuation compensation method for compensating a fluctuation of a power source voltage supplied to an operation circuit by using a periodic signal changing section and a power current consumption circuit, where the periodic signal changing section receives a power source voltage from a power source shared with the operation circuit, and outputs a changed signal resulting from changing a supplied periodic signal according to the power source voltage, and the power current consumption circuit shares a power source with the operation circuit, the load fluctuation compensation method including: initializing to generate a bias voltage supplied to the periodic signal changing section and adjust a changed amount in the periodic signal changing section to a preset value, based on a result of comparing a phase of the periodic signal with a phase of the changed signal outputted from the periodic signal changing section; and controlling a power current consumed by the power current consumption circuit, based on a fluctuation of the changed amount in the periodic signal changing section caused after the adjustment of the changed amount in the periodic signal changing section. An arrangement is also possible in which the periodic signal changing section includes a delay circuit, and outputs a delayed signal resulting from delaying the periodic signal by a delay amount corresponding to the power source voltage, in the initializing, a bias voltage supplied to the delay circuit is generated and a delay amount in the delay circuit is adjusted to a preset value, based on a result of comparing a phase of the periodic signal with a phase of the delayed signal, and in the controlling, a power current consumed by the power current consumption circuit is controlled, based on a fluctuation of the delay amount in the delay circuit caused after the adjustment of the delay amount in the delay circuit. An arrangement is also possible in which the periodic signal changing section includes an oscillator circuit, and outputs an oscillation signal resulting from converting the periodic signal into a frequency corresponding to the power source voltage, in the initializing, a bias voltage supplied to the oscillator circuit is generated and an oscillation frequency in the oscillator circuit is adjusted to a preset value, based on a result of comparing a phase of a supplied periodic signal with a phase of the oscillation signal, and in the controlling, a power current consumed by the power current consumption circuit is controlled, based on a fluctuation of the oscillation frequency in the oscillator circuit caused after the adjustment of the oscillation frequency in the oscillator circuit.

The disclosure of the invention described above does not necessarily describe all necessary features of the present invention. Any sub-combination of the features described above may also constitute the present invention.

BEST MODE FOR CARRYING OUT THE INVENTION

As follows, the present invention is described based on some embodiments, which do not intend to limit the invention that relates to the scope of claims. Not all the combinations of the features described in the embodiments are necessarily essential to the means for solving the invention.

Figure 1:
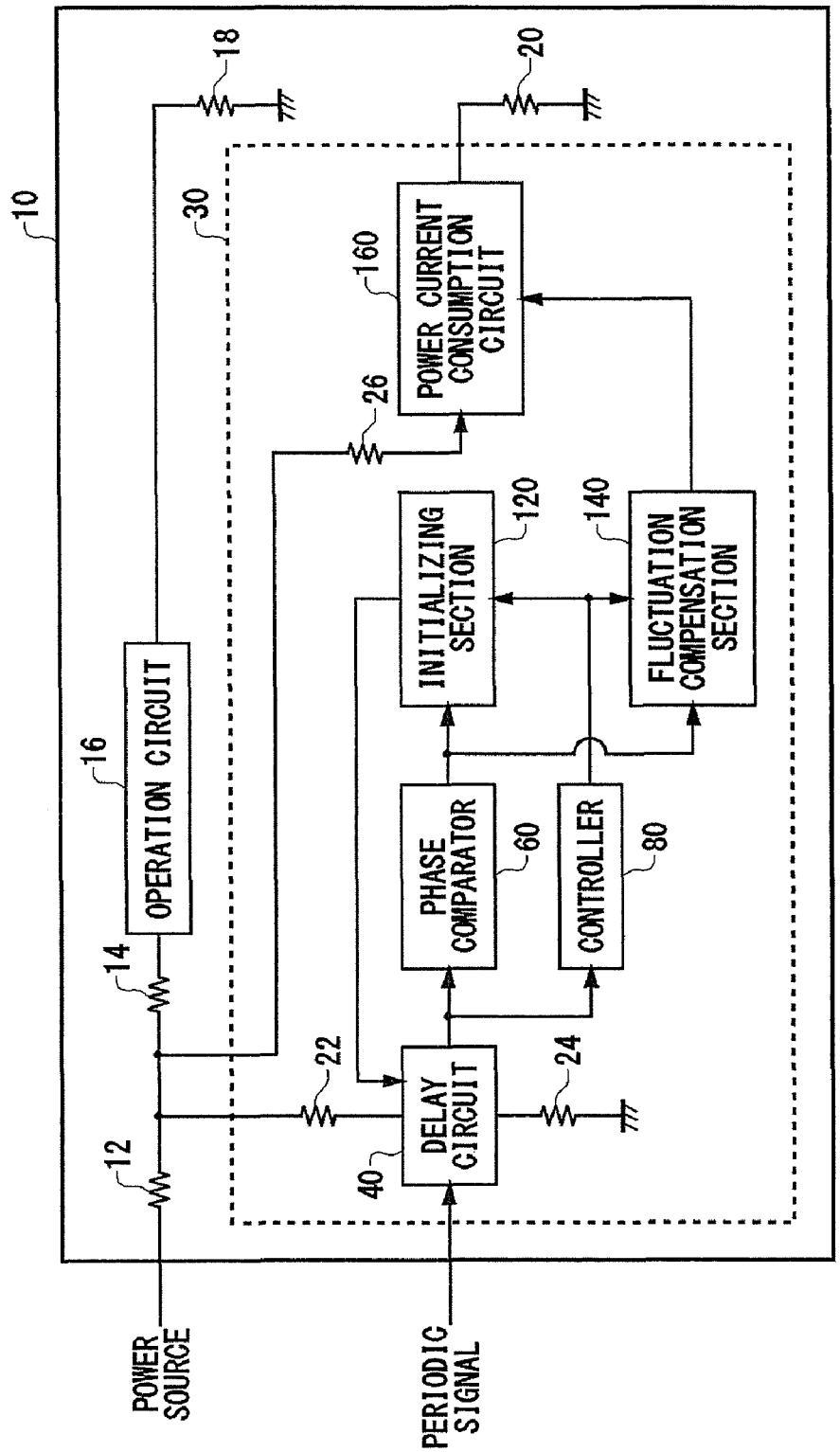
FIG. 1 shows an exemplary configuration of an electronic device 100 according to an embodiment of the present invention.

FIG. 1 shows an exemplary configuration of an electronic device 100 according to an embodiment of the present invention. The electronic device 100 may be a device such as a semiconductor chip for example, and includes a substrate 10, an operation circuit 16, and a load fluctuation compensation circuit 30. The operation circuit 16 and the load fluctuation compensation circuit 30 are provided on the same substrate 10.

The operation circuit 16 receives the power source voltage from the power source, and operates according to the power source voltage. For example, the operation circuit 16 may be a logic circuit that includes an element such as a transistor or the like that is driven according to the power source voltage. The operation circuit 16 receives the power source voltage via a source power supply line. The source power supply line has resistance components 12 and 14.

The load fluctuation compensation circuit 30 compensates the power source voltage supplied to the operation circuit 16. The power source current consumed by the operation circuit 16 fluctuates according to the operation state of the operation circuit 16. Thus, the voltage drop amount of the resistance components 12 and 14 also fluctuates, and therefore the power source voltage supplied to the operation circuit 16 fluctuates according to the operation state of the operation circuit 16. The load fluctuation compensation circuit 30 compensates the fluctuation of the power source voltage.

The load fluctuation compensation circuit 30 includes a delay circuit 40, a phase comparator 60, a controller 80, an initializing section 120, a fluctuation compensation section 140, and a power current consumption circuit 160. The delay circuit 40 receives a power source voltage from a power source shared with the operation circuit 16. The delay circuit 40 in the present example receives a power source voltage via a transmission path branched from a transmission path connecting between the resistance components 12 and 14. The transmission path includes a resistance component 22.

The delay circuit 40 outputs a delayed signal resulting from delaying a supplied periodic signal by a delay amount according to the power source voltage. Here, the periodic signal has substantially constant cycles. The delay circuit 40 has a delay amount fluctuating according to a supplied power source voltage. For example, the delay circuit 40 includes a plurality of serially connected buffers, and the power source voltage is supplied to each of the buffers. Therefore, the delay circuit 40 converts the fluctuation of the power source voltage into the fluctuation of the delay amount.

The phase comparator 60 compares a phase of a periodic signal inputted to the delay circuit 40 with a phase of a delayed signal outputted from the delay circuit 40. For example, the phase comparator 60 outputs a binary comparison result representing which of the phases of the periodic signal and the delayed signal is ahead of the other.

The initializing section 120 generates a bias voltage supplied to the delay circuit 40, based on the comparison result of the phase comparator 60. The initializing section 120 adjusts the bias voltage so that the phase difference between the periodic signal and the delayed signal becomes a preset value. That is, the delay circuit 40, the phase comparator 60, and the initializing section 120 function as a first delay lock loop. The first delay lock loop sets the delay amount of the delay circuit 40 to a preset value.

The initializing section 120 in the present example adjusts the bias voltage so that the phase of the periodic signal is substantially equal to the phase of the delayed signal. In this case, the initializing section 120 adjusts the bias voltage so that the delay amount in the delay circuit 40 corresponds to a preset delay amount, e.g., 1 cycle of a periodic signal. For example, when the phase of the delayed signal is ahead of the phase of the periodic signal, the initializing section 120 adjusts the bias voltage so that the delay amount increases in the delay circuit 40. On the contrary, when the phase of the delayed signal is delayed with respect to the phase of the periodic signal, the initializing section 120 adjusts the bias voltage so that the delay amount decreases in the delay circuit 40.

The controller 80 holds the bias voltage outputted from the initializing section 120 when the phase difference between the periodic signal and the delayed signal has become the aforementioned preset value. In the present example, the controller 80 holds the bias voltage outputted from the initializing section 120 when the phase of the periodic signal becomes substantially equal to the phase of the delayed signal. Here, the expression "to hold a bias voltage" is used to control the initializing section 120 to output a bias voltage while fixing the level. According to the stated operation, the phase difference between the periodic signal and the delayed signal can be fixed when there is no fluctuation in power source voltage.

The power current consumption circuit 160 has a power source shared with the operating circuit 16. The power current consumption circuit 160 also has a power source shared with the delay circuit 40. In the present example, the power current consumption circuit 160 receives a power source voltage via a transmission path branched from the transmission path connecting between the resistance components 12 and 14. The transmission path via which the power current consumption circuit 160 receives the power source voltage includes a resistance component 26.

The fluctuation compensation section 140 controls the power current amount to be supplied to the power current consumption circuit 160, based on the comparison result outputted from the phase comparator 60 while the bias voltage of the initializing section 120 is kept on hold. Specifically, the fluctuation compensation section 140 controls the power current to be consumed by the power current consumption circuit 160, based on the fluctuation in delay amount in the delay circuit 40 that has been caused after the delay amount has been adjusted by the initializing section 120. To be more specific, the fluctuation compensation section 140 detects a fluctuation in delay amount in the delay circuit 40 having been caused due to the fluctuation in power source voltage, from the comparison result while the bias voltage of the initializing section 120 is kept on hold. Then, the fluctuation compensation section 140 controls the power current amount to be supplied to the power current consumption circuit 160, so as to control the voltage drop amount of the resistance component 12 thereby compensating the fluctuation in power source voltage supplied to the operation circuit 16.

Since the power current consumption circuit 160 has a power source shared with the delay circuit 40, the delay circuit 40, the phase comparator 60, the fluctuation compensation section 140, and the power current consumption circuit 160 function as a second delay lock loop. The second delay lock loop is capable of determining whether the fluctuation in power source voltage supplied to the operation circuit 16 has been compensated or not, based on the fluctuation in delay amount of the delay circuit 40. The stated configuration enables compensation of the fluctuation in power source voltage supplied to the operation circuit 16.

The resistance component 22 and the resistance component 26 preferably have a resistance value at which fluctuation in voltage drop can be ignored. For example, when the delay fluctuation caused by the power source voltage fluctuation in the delay circuit 40 is no greater than 5 ps, and the delay fluctuation due to the power source voltage fluctuation in the delay circuit 40 is 8.5 ps/mV, the power source voltage fluctuation is 0.59 mV. In this case, the resistance component 22 and the resistance component 26 have a resistance value by which the fluctuation in voltage drop is no greater than 0.59 mV, even when the power current running from the branch point has fluctuated. For example, the power source transmission distance from the branch point to the delay circuit 40 as well as the power source transmission distance from the branch point to the power current consumption circuit 160 can be substantially 0.

Figure 2:
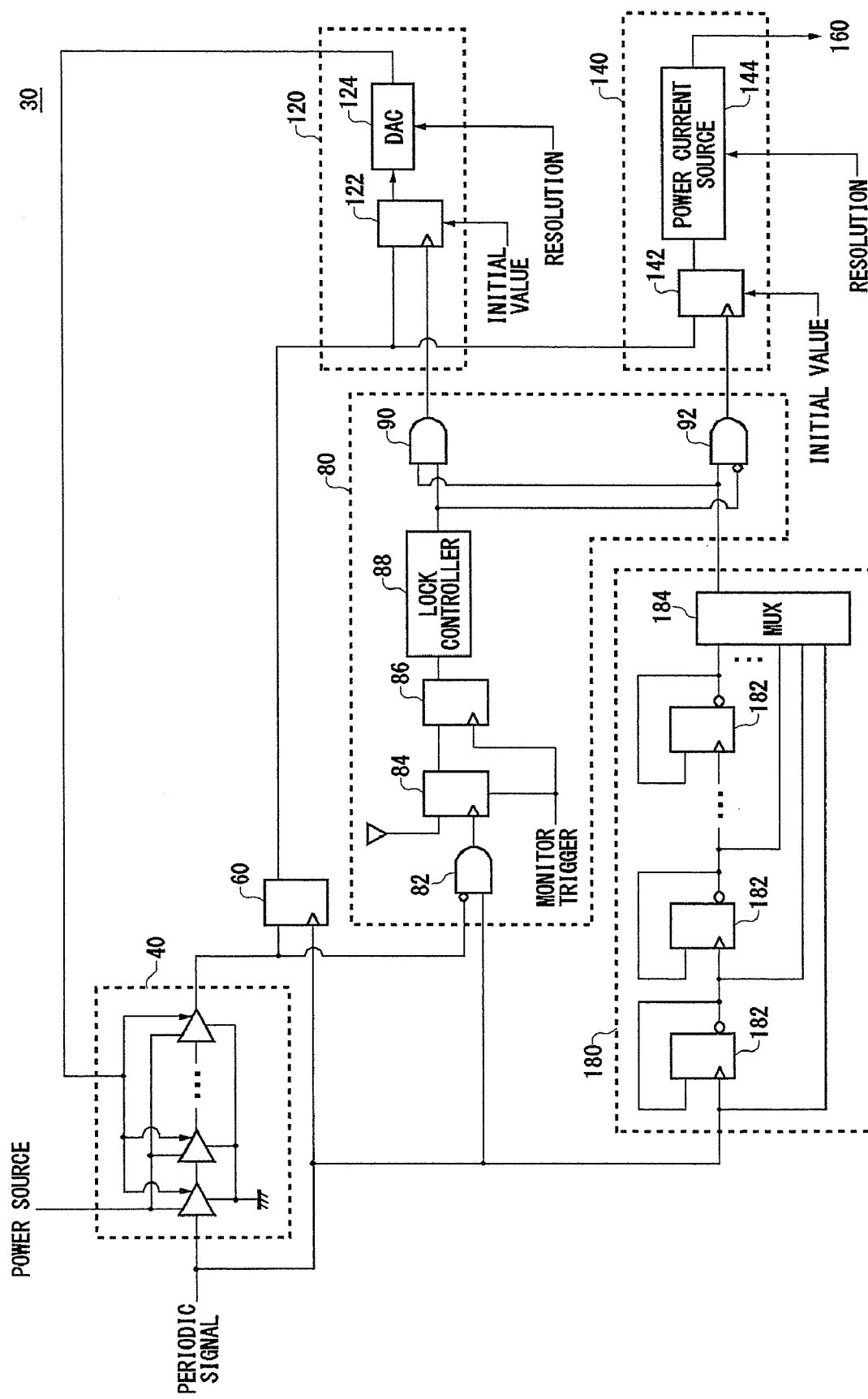
FIG. 2 shows an exemplary detailed configuration of a load fluctuation compensation circuit 30.

FIG. 2 shows an exemplary detailed configuration of a load fluctuation compensation circuit 30. The load fluctuation compensation circuit 30 in the present example further includes a frequency dividing circuit 180 in addition to the configuration explained with reference to FIG. 1. The delay circuit 40 in the present example includes a plurality of serially connected buffers. The plurality of buffers delay a periodic signal by sequentially propagating the inputted periodic signal. The delay time can be controlled by controlling the power source voltage supplied to these plurality of buffers.

The phase comparator 60 in the present example is a flip flop that receives a periodic signal as an operation clock, and receives a delayed signal as an input signal. For example, the phase comparator 60 samples a delayed signal at the timing of a leading edge of a periodic signal. Accordingly, the phase comparator 60 outputs a comparison result representing which of the phases of the periodic signal and the delayed signal is ahead of the other.

The initializing section 120 in the present example includes a first counter 122 and a DA converter 124. The first counter 122 outputs a first counter value that is incremented or decremented according to the comparison result of the phase comparator 60. The DA converter 124 outputs a bias voltage of a level corresponding to the first counter value.

The fluctuation compensation section 140 in the present example includes a second counter 142 and a power current source 144. The second counter 142 outputs a second counter value that is incremented or decremented according to the comparison result of the phase comparator 60. The power current source 144 generates a power current in accordance with the second counter value outputted from the second counter 142, and supplies the generated power current to the power current consumption circuit 160.

The controller 80 in the present example includes an AND circuit 82, a flip flop 84, a flip flop 86, a lock controller 88, an AND circuit 90, and an AND circuit 92. The AND circuit 82, the flip flop 84, and the flip flop 86 determine whether the phase difference between the periodic signal and the delayed signal is a preset value. The lock controller 88 controls which of the first counter 122 and the second counter 142 to operate based on the determination result outputted from the flip flop 86.

For example, when the phase difference between the periodic signal and the delayed signal is not yet a preset value, the lock controller 88 supplies an operation clock to the first counter 122, and stops supply of an operation clock to the second counter 142. According to this, the first delay lock loop is kept operating until the phase difference between the periodic signal and the delayed signal reaches the preset value. That is, the delay amount in the delay circuit 40 can be set to a preset value.

When the phase difference between the periodic signal and the delayed signal has become the preset value, the lock controller 88 stops supply of an operation clock to the first counter 122, and starts supplying an operation clock to the second counter 142. According to this, the second delay lock loop can be operated while the bias voltage of the initializing section 120 is kept in the hold state. This means that the power current consumption circuit 160 can be controlled to consume a power current according to the fluctuation in delay amount in the delay circuit 40.

The aforementioned operation clock may be generated by the frequency dividing circuit 180. In the present example, the frequency dividing circuit 180 generates the operation clock, by dividing the frequency of the periodic signal by a preset frequency dividing ratio. The frequency dividing circuit 180 in the present example includes a plurality of flip flops 182 such that in each flip flop 182 an inverted output terminal of itself is connected to an input terminal of itself and to the next-stage input terminal. The frequency dividing circuit 180 in the present example also includes a multiplexer 184 that selects one of signals outputted from the flip flops 182, and outputs the selected signal to outside. Thus, the frequency dividing circuit 180 generates an operation clock having a desired frequency dividing ratio.

The AND circuit 90 and the AND circuit 92 each receive a corresponding portion of an operation clock outputted from the frequency dividing circuit 180. The lock controller 88 controls which one of the AND circuit 90 and the AND circuit 92 to pass through the operation clock. According to the stated configuration, the fluctuation of the power source voltage supplied to the operation circuit 16 can be compensated.

Figure 3A:
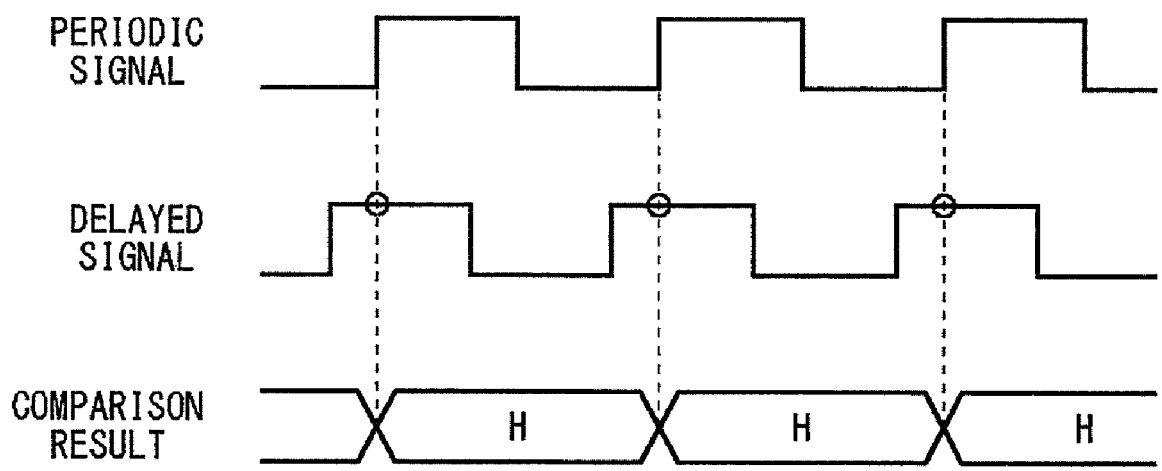
FIG. 3A and FIG. 3B are a timing chart showing an exemplary operation of a phase comparator 60.
Figure 3B:
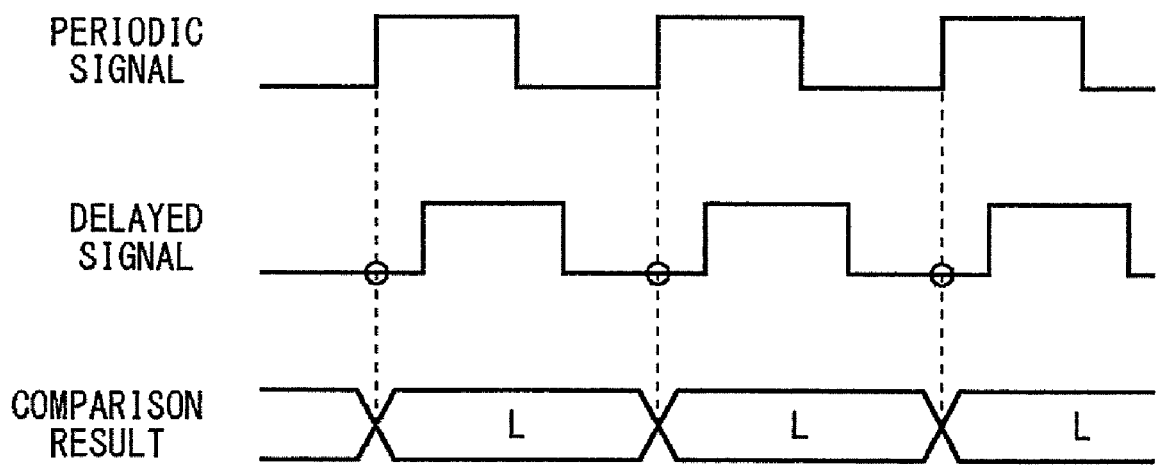

FIG. 3A and FIG. 3B are a timing chart showing an exemplary operation of a phase comparator 60. When the delay amount in the delay circuit 40 is smaller than 1 cycle of a periodic signal (FIG. 3A), the phase comparator 60 outputs a comparison result of H logic. When the delay amount in the delay circuit 40 is larger than 1 cycle of a periodic signal (FIG. 3B), the phase comparator 60 outputs a comparison result of L logic.

The first counter 122 outputs a first counter value that is incremented or decremented based on the comparison result. For example, when the delay amount in the delay circuit 40 is incremented according to the increase in bias voltage, and when the phase comparator 60 outputs a comparison result of H logic as shown in FIG. 3A, the first counter 122 increments the first counter value. The DA converter 124 outputs a bias voltage of the incremented level corresponding to the increase in the first counter value. Accordingly, the delay amount in the delay circuit 40 increases.

Figure 4:
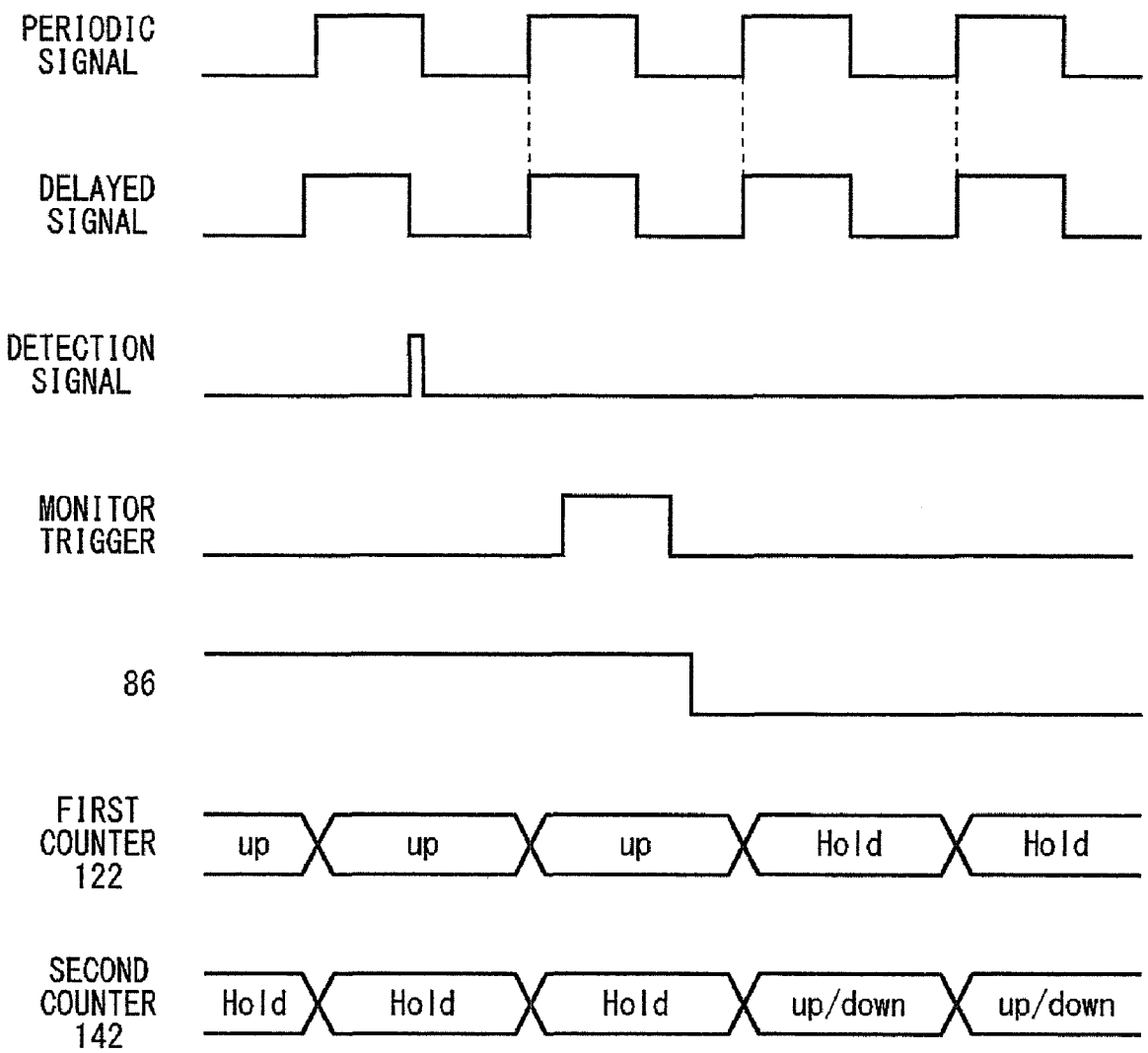
FIG. 4 shows an exemplary operation of a controller 80.

FIG. 4 shows an exemplary operation of the controller 80. As already stated, the controller 80 first operates the first counter 122, and when the phase difference between the periodic signal and the delayed signal has become the preset value, holds the first counter 122, and to start operating the second counter 142.

The AND circuit 82 shown in FIG. 2 outputs AND between the periodic signal and the inverted signal of the delayed signal, as a detection signal. The flip flop 84 receives a signal fixed to H logic as an input signal, and receives the detection signal as an operation clock. The data value retained by the flip flop 84 is set to an initial value in a preset cycle by means of a monitor trigger supplied in the preset cycles in the initialization stage. Here, the initial value of the data value of the flip flop 84 is assumed to be L logic. The flip flop 86 receives a signal outputted from the flip flop 84 as an input signal, and receives the monitor trigger as an operation clock.

Specifically, the AND circuit 82 keeps outputting the detection signal until the phase of the periodic signal becomes substantially equal to the phase of the delayed signal. The flip flop 84 takes in a signal of H logic according to the detection signal. In addition, the data value of the flip flop 84 is initialized on a regular basis by a monitor trigger. Therefore, unless a detection signal is inputted after a monitor trigger is inputted, the output from the flip flop 84 becomes L logic according to the monitor trigger. In this case, the output of the flip flop 86 also becomes L logic according to the monitor trigger. The stated configuration enables determination as to whether the phase of the periodic signal has matched the phase of the delayed signal.

The lock controller 88 outputs H logic when the phase of the periodic signal has not matched the phase of the delayed signal. When the phase of the periodic signal has substantially matched the phase of the delayed signal, the lock controller 88 outputs L logic. The AND circuit 90 outputs AND between the output of the lock controller 88 and the operation clock outputted from the frequency dividing circuit 180. The AND circuit 92 outputs AND between an inverted logic of the output of the lock controller 88 and the operation clock outputted from the frequency dividing circuit 180.

According to the stated configuration, the first counter 122 can be kept operating until the phase of the periodic signal has substantially matched the phase of the delayed signal, during which the second counter 142 is kept on hold. When the phase of the periodic signal has substantially matched the phase of the delayed signal, the second counter 142 can be controlled to start operating, during which the first counter 122 is kept on hold.

When the flip flop 86 has outputted L logic, the lock controller 88 may stop supply of a monitor trigger to the flip flop 84 and the flip flop 86. Accordingly, further operation of the initializing section 120 is prevented after locking of the delay amount in the delay circuit 40. Furthermore, a delay element may be provided for a clock input of the flip flop 86, so that the AND circuit 82 compare the phase between the periodic signal and the delayed signal at least one time during a period after a monitor trigger is inputted to the flip flop 84 and before a monitor trigger is inputted to the flip flop 86. Moreover, the operation of the flip flop 84 should preferably be adapted to an operation clock having a minute pulse width.

Figure 5:
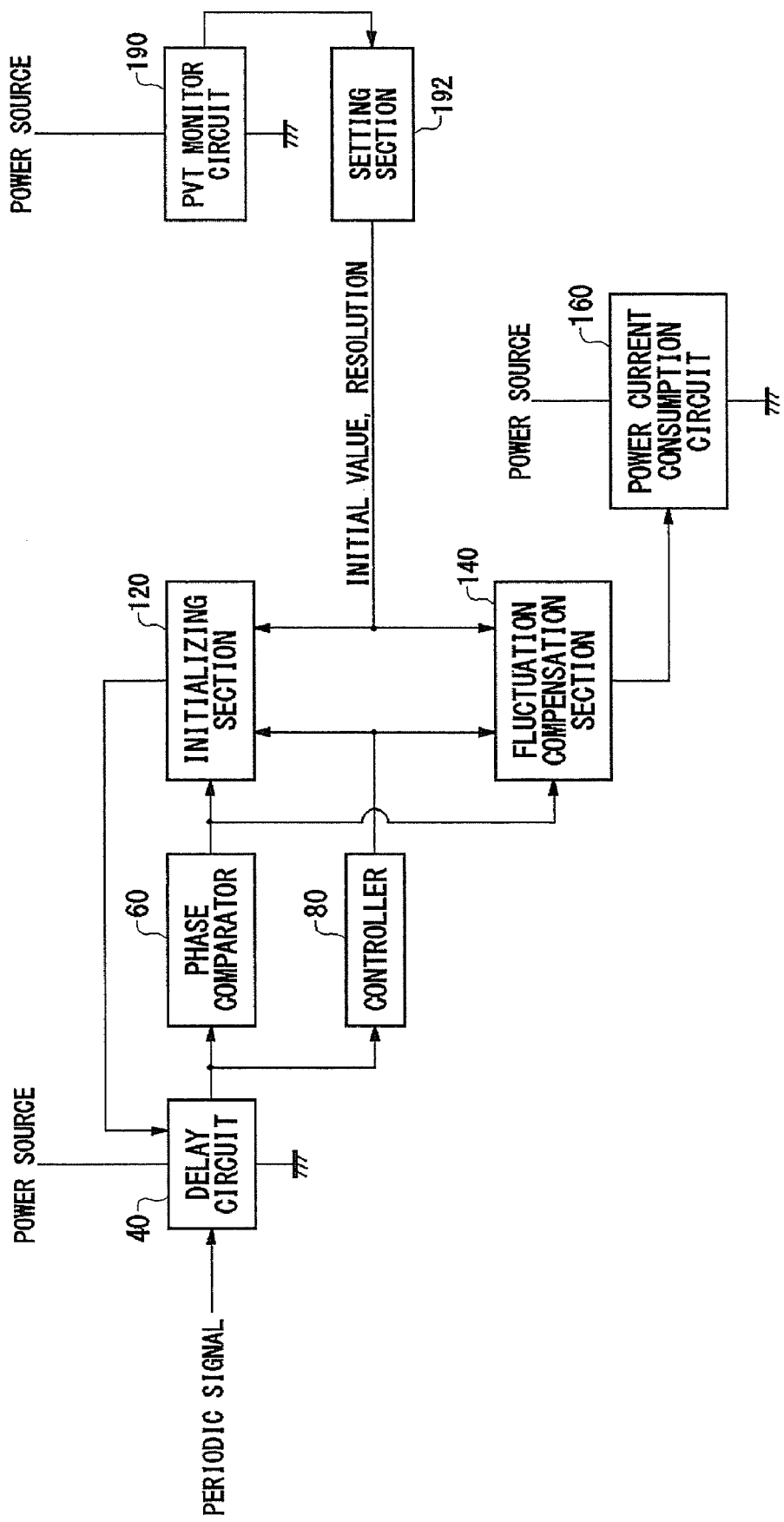
FIG. 5 shows another exemplary configuration of the load fluctuation compensation circuit 30.

FIG. 5 shows another exemplary configuration of the load fluctuation compensation circuit 30. The load fluctuation compensation circuit 30 in the present example includes a PVT monitor circuit 190 and a setting section 192, in addition to the configuration of the load fluctuation compensation circuit 30 explained with reference to FIG. 1. The other constituting elements have substantially the same function and configuration as the constituting elements assigned the same reference numerals in FIG. 1. The load fluctuation compensation circuit 30 in the present example compensates the parameter variations in the delay circuit 40 and the power current consumption circuit 160 attributable to the variations in the process, the temperature, and the power source voltage.

The PVT monitor circuit 190 is formed on the same substrate 10 on which the delay circuit 40 and the power current consumption circuit 160 are formed. Moreover, the PVT monitor circuit 190 is preferably formed in the same process in which the delay circuit 40 and the power current consumption circuit 160 are formed. The characteristic of the PVT monitor circuit 190 fluctuates according to at least one of the process, the power source voltage, and the temperature of the delay circuit 40 and the power current consumption circuit 160. For example, the PVT monitor circuit 190 may be a ring oscillator having a power source shared with the delay circuit 40 and the power current consumption circuit 160. In this case, the fluctuation of the characteristic of the PVT monitor circuit 190 can be detected by the fluctuation of cycles of the oscillation signal generated by the ring oscillator.

The setting section 192 detects the aforementioned fluctuation of the process, the power source voltage, and the temperature, by measuring the characteristic of the PVT monitor circuit 190. For example when the PVT monitor circuit 190 is a ring oscillator, the setting section 192 may detect the fluctuation of the process or the like, by measuring the cycles of the oscillation signal outputted from the PVT monitor circuit 190. In this case, the setting section 192 may be provided with a standard value of the cycles of the oscillation signal in advance, to detect the fluctuation of the process or the like, by a difference between the standard value and the measured value. The standard value may be obtained from the set value of the PVT monitor circuit 190.

The setting section 192 uses the measurement result to set the initial value of the first counter 122, the resolution of the DA converter 124, the initial value of the second counter 142, and the resolution of the power current source 144. The resolution of the DA converter 124 represents the amount of fluctuation of the bias voltage when the first counter value is either incremented or decremented by the unit amount.

When the first counter value is either incremented or decremented by the unit amount, the delay fluctuation amount in the delay circuit 40 is set to a preset value on condition that the first delay lock loop does not oscillate. However, oscillation of the first delay lock loop may occasionally happen attributed to a variation of the delay fluctuation amount due to the variation in process or the like. For this reason, the setting section 192 in the present example decreases the variation of the delay fluctuation amount, by adjusting the resolution of the DA converter 124 based on the variation in process or the like. Likewise, the setting section 192 adjusts the resolution of the power current source 144. The resolution of the power current source 144 represents the fluctuation amount of the power current outputted from the power current source 144 when the second counter value is either incremented or decremented by the unit amount.

The first counter value may be designed to a preset initial value on condition that the first delay lock loop does not cause a cycle slip. Here, the cycle slip is a phenomenon in which the delay amount in the delay circuit 40 is locked by a delay amount corresponding to 2 cycles of a periodic signal while it should really be locked by a delay amount corresponding to 1 cycle of the periodic signal. For example, when the delay amount in the delay circuit 40 is larger than 1.5 cycles of a periodic signal, the first delay lock loop causes the phase of the edge of the delayed signal to be substantially equal to the phase of the edge of the periodic signal, by further increasing the delay amount in the delay circuit 40. Therefore, it is necessary to set the initial value of the first counter value so as not to prevent a cycle slip. However, the delay amount corresponding to the initial value also fluctuates according to variations of a process or the like. Therefore, the setting section 192 in the present example decreases the occurrences of the cycle slips by adjusting the initial value of the first counter 122 based on the variations of a process or the like. The setting section 192 in the present example sets an initial value that yields the delay amount of the delay circuit 40 to correspond to 1 cycle of the periodic signal, based on the characteristic of the PVT monitor circuit 190. The setting section 192 also adjusts the initial value of the second counter 142.

Figure 6:
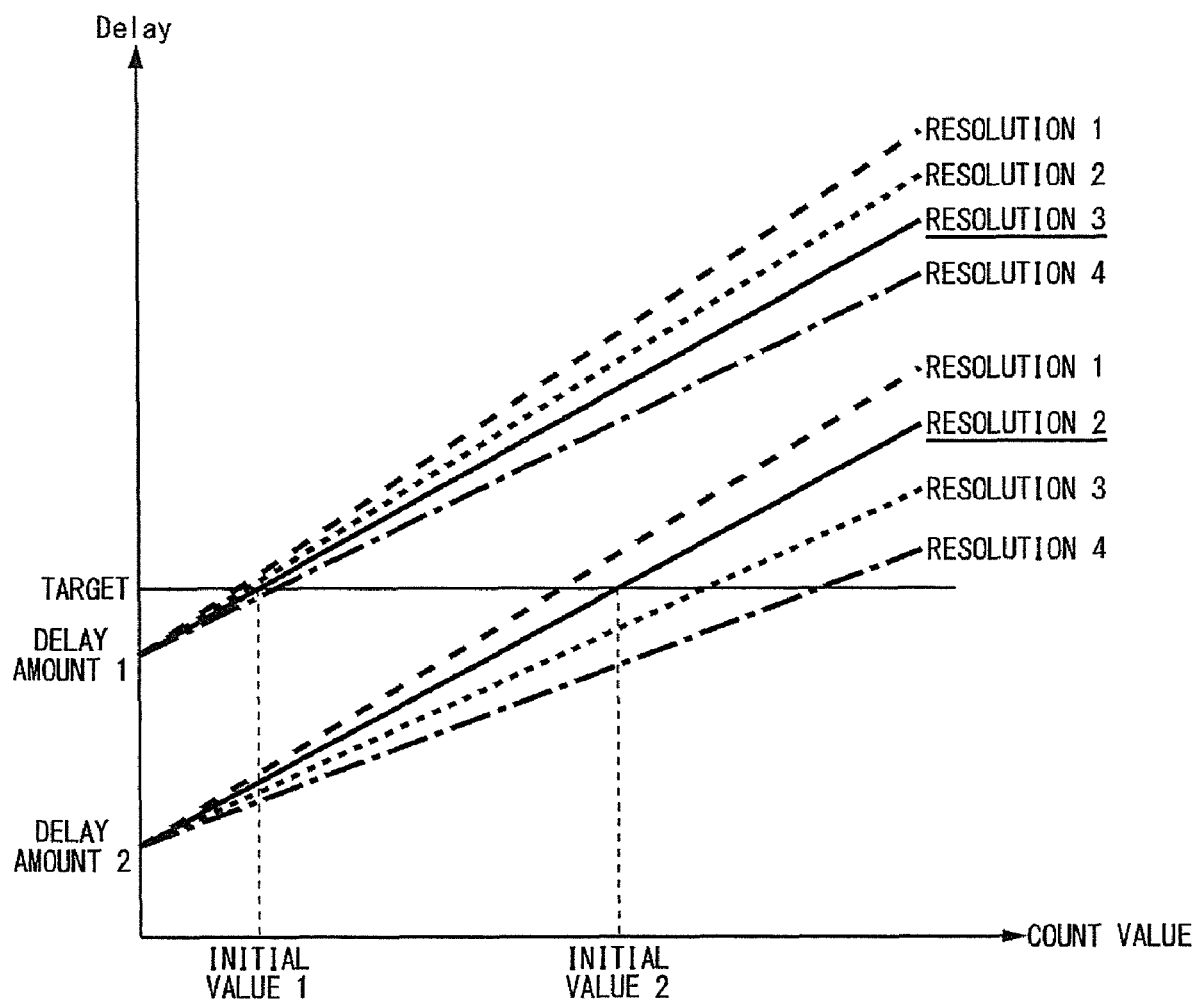
FIG. 6 shows an exemplary relationship of a delay amount in a delay circuit 40 with respect to the counter value of a first counter 122.

FIG. 6 an exemplary relationship of a delay amount in the delay circuit 40 with respect to the counter value of a first counter 122. The delay amount in the delay circuit 40 changes according to the aforementioned variations of a process or the like. For example, even when the count value is the same, the delay amount in the delay circuit 40 fluctuates as shown by "delay amount 1" and "delay amount 2."

Moreover as shown in FIG. 6, each gradient of the relation between the count value and the delay amount changes according to the resolution of the DA converter 124. Even when the same resolution is set to the DA converter 124, the gradient of the relation between the count value and the delay amount still changes for different delay amounts with the same count value.

As described above, the gradient of the relation between the count value and the delay amount is preferably a preset value on condition that there is no oscillation. A specific delay amount in the delay circuit 40 for a certain count value is obtainable from the measurement result of the PVT monitor circuit 190. Accordingly, the resolution to be set to the DA converter 124 can be determined for each measurement result of the PVT monitor circuit 190.

The setting section 192 may store, in advance, a table representing the resolutions of the DA converter 124 to be set to respective measurement results of the PVT monitor circuit 190. The setting section 192 sets a resolution corresponding to a measurement result of the PVT monitor circuit 190, by referring to the table. Likewise, the setting section 192 may store, in advance, a table representing the resolutions of the power current source 144 to be set to respective measurement results of the PVT monitor circuit 190.

Also as shown in FIG. 6, the initial value of the count value that corresponds to the targeted delay amount to be set as an initial value as the delay amount in the delay circuit 40 fluctuates according to variations of a process or the like. As shown in FIG. 6, the initial value of the count value is determined by variations in the delay amount due to the variations of the process or the like ("delay amount 1" and "delay amount 2" or the like in FIG. 6) as well as the resolution set to the DA converter 124.

The setting section 192 may store, in advance, a table representing the resolution of the DA converter 124 and the initial value of the first count value, to be set to respective measurement results of the PVT monitor circuit 190. For example, assume that the delay amount 1 in FIG. 6 corresponds to the measurement result 1 of the PVT monitor circuit 190 and the delay amount 2 corresponds to the measurement result 2 of the PVT monitor circuit 190. Also assume that the gradient of the relation between the count value and the delay amount is set to the gradient of the solid line shown in FIG. 6. Under these assumptions, the setting section 192 stores a table where the measurement result 1 is associated with the resolution 3 to be set to the DA converter 124 and the initial value 1 to be set to the first counter value, and where the measurement result 2 is associated with the resolution 2 and the initial value 2. In addition, the setting section 192 may store a table containing more measurement results associated with resolutions and initial values.

The setting section 192 may also store, in advance, a table representing the resolution of the power current source 144 and the initial value of the second counter value, which are to be set to respective measurement results of the PVT monitor circuit 190. The load fluctuation compensation circuit 30 in the present example can compensate variations in characteristic of the delay circuit 40 attributable to the variations of a process or the like. Accordingly, the load fluctuation in the operation circuit 16 can be compensated with accuracy.

Figure 7:
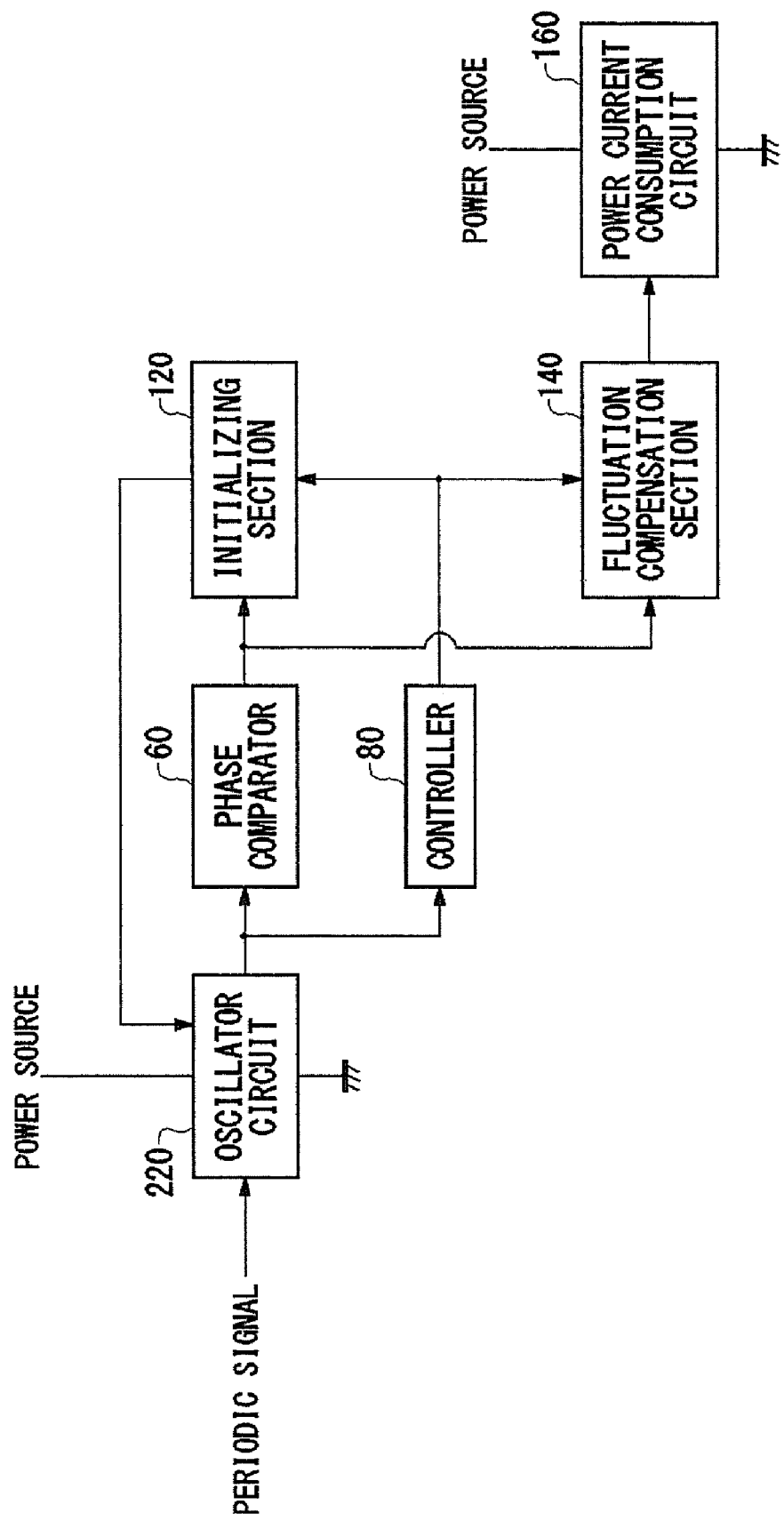
FIG. 7 shows another exemplary configuration of the load fluctuation compensation circuit 30.

FIG. 7 shows another exemplary configuration of the load fluctuation compensation circuit 30. The load fluctuation compensation circuit 30 in the present example is compared to the load fluctuation compensation circuit 30 explained with reference to FIG. 1, however includes an oscillator circuit 220 in place of the delay circuit 40. The other constituting elements thereof are the same as their counterparts of the load fluctuation compensation circuit 30 explained with reference to FIG. 1. The frequency dividing circuit 180 explained with reference to FIG. 2 may further be included therein.

The oscillator circuit 220 receives a power source voltage from a power source shared with the operation circuit 16, and outputs an oscillation signal of a frequency corresponding to the power source voltage. In other words, the oscillator circuit 220 constitutes a phase locked loop instead of the delay lock loop in the load fluctuation compensation circuit 30 explained with reference to FIG. 1-FIG. 6. In the drawing from FIG. 1 to FIG. 6, the fluctuation of delay amount caused by the fluctuation of power source voltage is detected after the delay amount in the delay circuit 40 has been locked. However, in the present example, the fluctuation of oscillation frequency caused due to the fluctuation of power source voltage is detected after locking the oscillation frequency of the oscillator circuit 220.

For example, the initializing section 120 generates a bias voltage supplied to the oscillator circuit 220, based on the comparison result between the phase of the supplied periodic signal and the phase of the oscillation signal, thereby adjusting the oscillation frequency in the oscillator circuit 220 to a preset value. The fluctuation compensation section 140 controls the power current consumed by the power current consumption circuit 160 based on the fluctuation of the oscillation frequency in the oscillator circuit 220 having been caused after the initializing section 120 has adjusted the oscillation frequency in the oscillator circuit 220.

The oscillator circuit 220 in the present example may be a ring oscillator in which a plurality of inverters are connected as a loop. Each inverter is supplied with a power source voltage from a power source shared with the operation circuit 16. Even this configuration enables the load fluctuation of the operation circuit 16 to be compensated.

Figure 8:
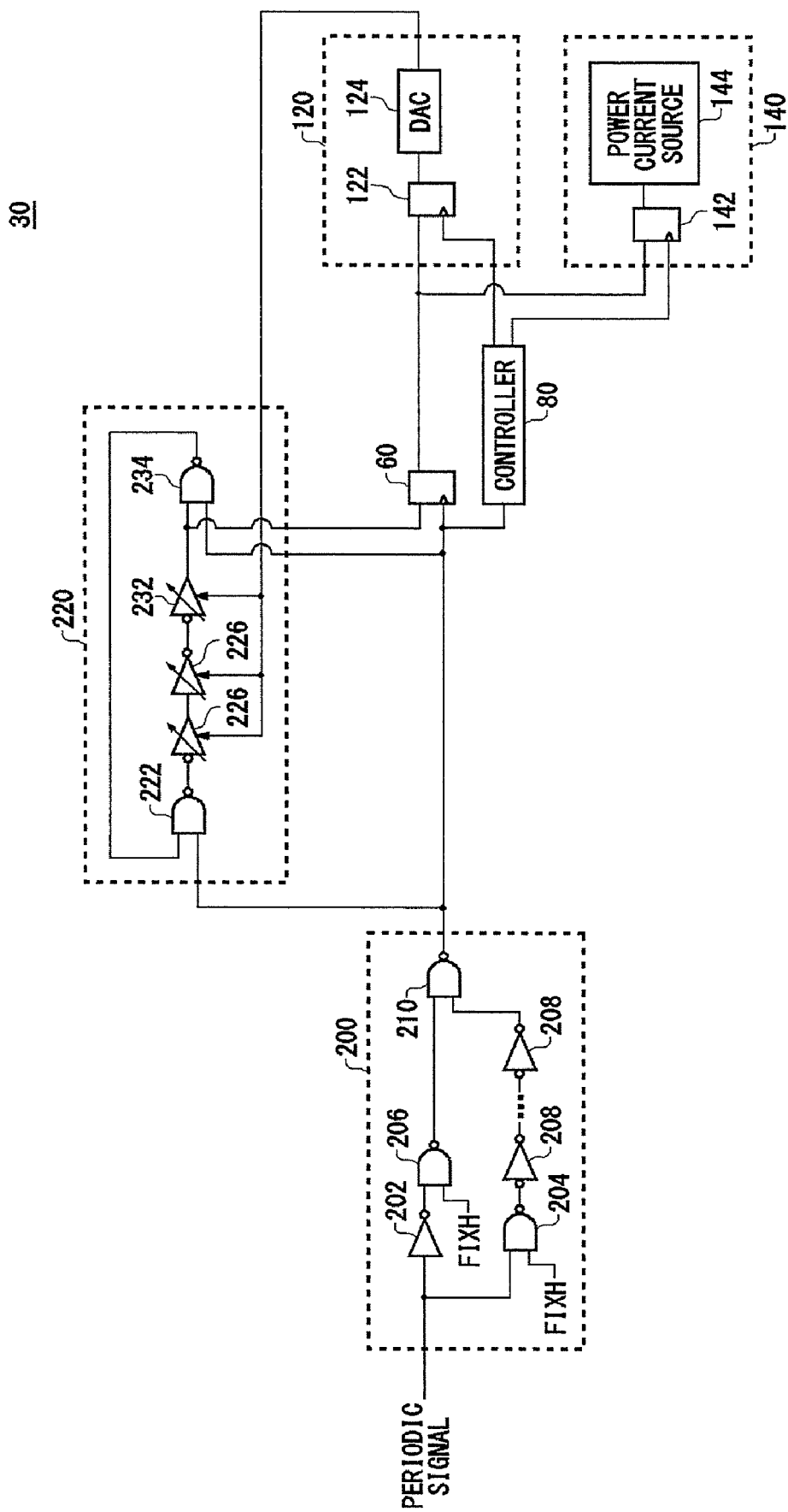
FIG. 8 shows another exemplary detailed configuration of the load fluctuation compensation circuit 30.

FIG. 8 shows another exemplary detailed configuration of the load fluctuation compensation circuit 30. The load fluctuation compensation circuit 30 in the present example further includes a pulse generator 200 in addition to the configuration of the load fluctuation compensation circuit 30 explained with reference to FIG. 7. The pulse generator 200 outputs a pulse of a preset pulse width according to either the leading edge or the trailing edge of a periodic signal. In addition, each time the oscillator circuit 220 receives a pulse from the pulse generator 200, the oscillator circuit 220 stops the oscillation according to the pulse, and starts new oscillation according to the pulse. According to such control, the shift of the phase of the oscillation signal with respect to the periodic signal can be prevented from being accumulated, thereby preventing a cycle slip. The oscillation frequency of the oscillator circuit 220 may oscillate, at a periodic signal divided by an integer. Accordingly, the load fluctuation compensation circuit 30 in the present example can dispense with a PVT monitor circuit 190 or the setting section 192 explained with reference to FIG. 5.

The oscillator circuit 220 is such that a plurality of inverters (226, 232) are connected as a loop. The oscillator circuit 220 further includes AND circuits (222, 234). The AND circuit 222 receives a signal outputted from the inverter 232 via the AND circuit 234, and inputs, to the inverter 226, a negative AND between the signal and a signal supplied from the pulse generator 200. That is, the oscillation in the oscillator circuit 220 can be stopped by inputting L logic to the AND circuit 222 from the pulse generator 200. In addition, the oscillation in the oscillator circuit 220 can be started by inputting H logic from the pulse generator 200.

The pulse generator 200 outputs a pulse of a preset pulse width according to either the leading edge or the trailing edge of a periodic signal. In the present example, the pulse generator 200 includes inverters (202, 208) and AND circuits (204, 206, 210). The inverter 202 inverts a periodic signal and outputs the inverted periodic signal.

The plurality of cascaded inverters 208 receive a periodic signal via the AND circuit 204, and delays the periodic signal. The AND circuit 210 receives a signal outputted from the inverter 202 via the AND circuit 206, and outputs a negative AND between the signal and a signal outputted from the inverter 208. According to this configuration, the pulse of a pulse width corresponding to a delay time in the plurality of inverters 208 is outputted according to the leading edge of the periodic signal. In the present example, the oscillator circuit 200 stops oscillation according to the leading edge of the pulse outputted from the pulse generator 200, and starts oscillation according to the trailing edge of the pulse.

The phase comparator 60 receives an oscillation signal outputted from the inverter 232. The phase comparator 60 takes in the received signal according to the pulse outputted from the pulse generator 200. The configuration and the operation of the initializing section 120, the controller 80, and the fluctuation compensation section 140 may be the same as the configuration and the operation of their counterparts assigned the same reference numerals in FIG. 1.

Figure 9:
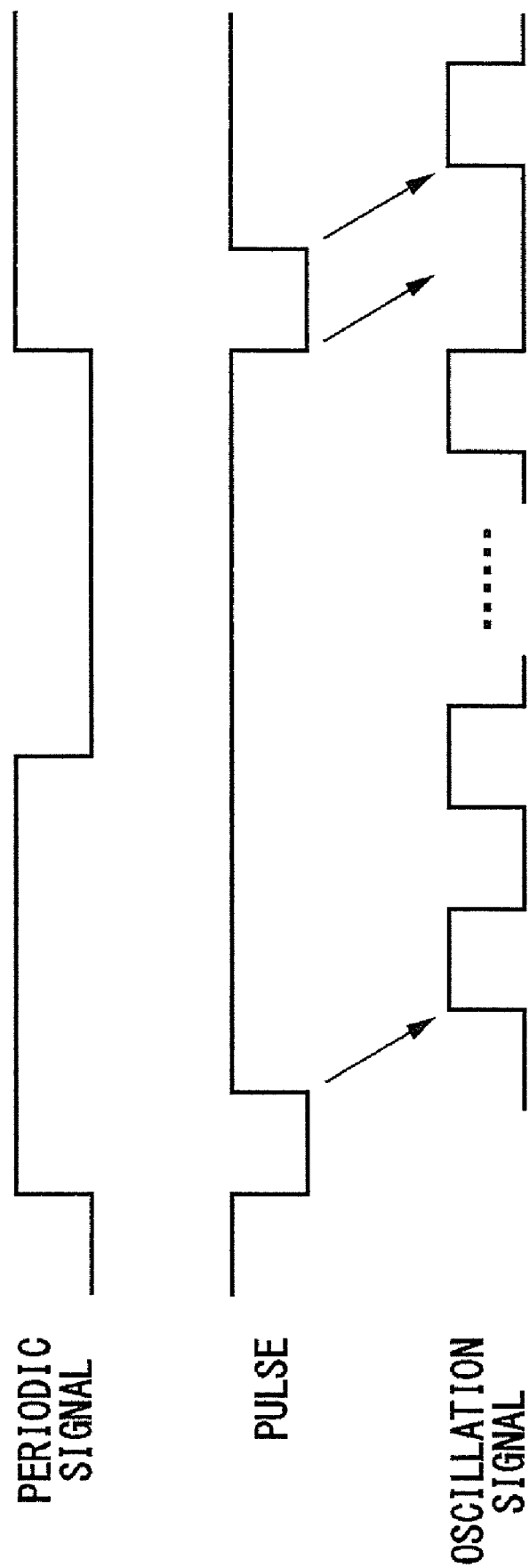
FIG. 9 is a timing chart showing an exemplary operation of the load fluctuation compensation circuit 30 explained with reference to FIG. 8.

FIG. 9 is a timing chart showing an exemplary operation of the load fluctuation compensation circuit 30 explained with reference to FIG. 8. As explained above, the pulse generator 200 outputs a pulse according to the leading edge of a periodic signal. The pulse generator 200 stops oscillation in the oscillator circuit 220 and starts new oscillation according to the pulse.

The oscillator circuit 220 inputs an oscillation signal to the phase comparator 60 after a preset delay time after the pulse has been inputted. An example of the delay time is a delay time in the inverter 232 or the like, which fluctuates according to a supplied power source voltage. The phase comparator 60 compares the phase of the pulse supplied from the pulse generator 200 with the phase of the oscillation signal. The initializing section 120 adjusts the bias voltage based on the comparison result. According to the stated configuration, the phase of the oscillation signal becomes substantially equal to the phase of the pulse outputted from the pulse generator 200. After the phase of the oscillation signal is locked, the fluctuation compensation section 140 is used to compensate the load fluctuation in the operation circuit 16. As stated above, the load fluctuation compensation circuit 30 in the present example prevents accumulation of the phase shift of the oscillation signal with respect to the periodic signal, thereby preventing a cycle slip.

Figure 10:
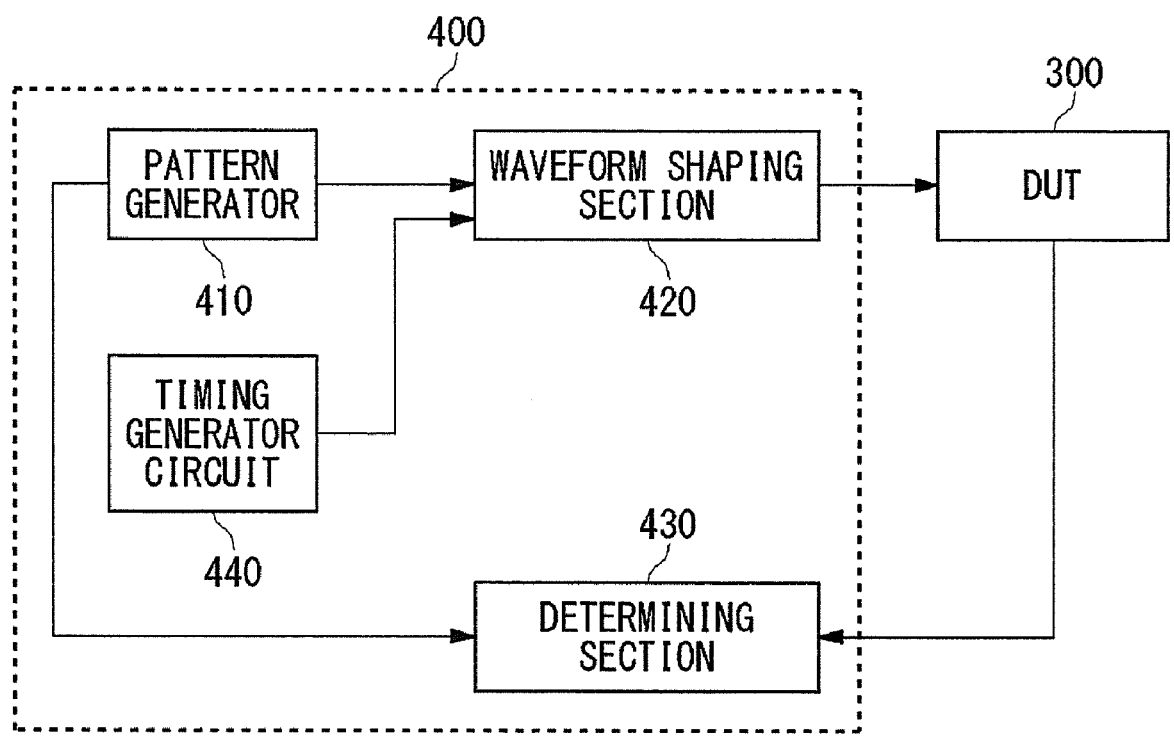
FIG. 10 shows an exemplary configuration of a test apparatus 400 that tests a device under test 300 such as a semiconductor chip.

FIG. 10 shows an exemplary configuration of a test apparatus 400 that tests a device under test 300 such as a semiconductor chip. The test apparatus 400 includes a pattern generator 410, a waveform shaping section 420, a determining section 430, and a timing generator circuit 440.

The pattern generator 410 generates a test pattern for testing the device under test 300. For example, the pattern generator 410 generates a digital test pattern having 1/0 pattern corresponding to a supplied test program.

The waveform shaping section 420 generates a test signal to be supplied to the device under test 300, based on the test pattern. For example, the waveform shaping section 420 generates the test signal representing a voltage level corresponding to the digital value of the test pattern, according to the edge of a supplied timing signal.

The timing generator circuit 440 generates a timing signal for specifying the phase of a test signal, and supplies the timing signal to the waveform shaping section 420. For example, the timing generator circuit 440 controls the phase of each pulse of a supplied reference clock to a desired phase, and outputs the resultant pulse.

The determining section 430 determines whether the device under test 300 is defective or not, based on an output signal from the device under test 300. For example, the determining section 430 compares the output signal from the device under test 300 with an expected value signal generated by the pattern generator 410 so as to determine whether the device under test 300 is defective or not.

Figure 11:
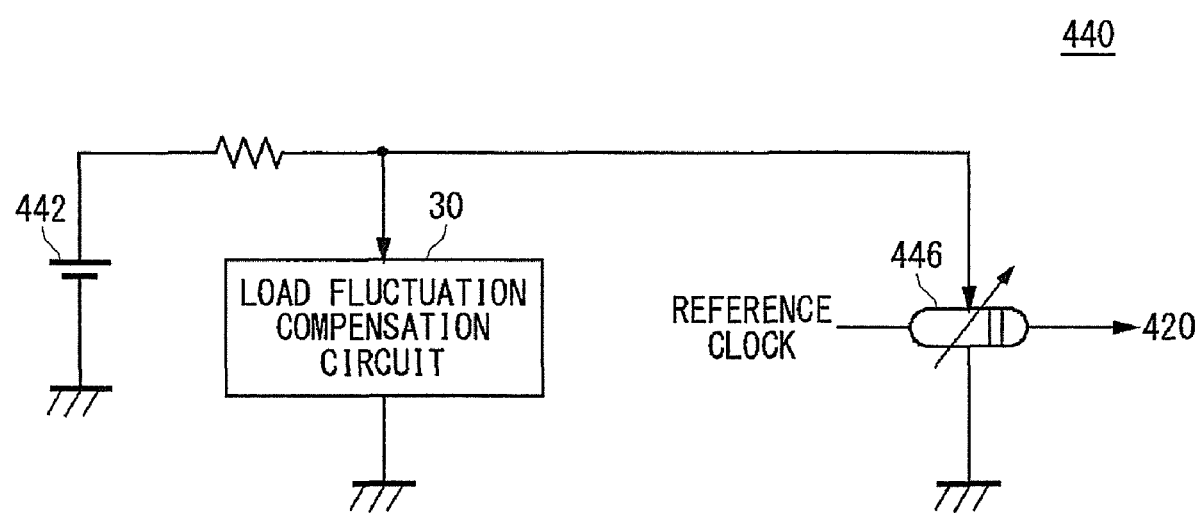
FIG. 11 shows an exemplary configuration of a timing generator circuit 440.

FIG. 11 shows an exemplary configuration of a timing generator circuit 440. The timing generator circuit 440 includes a power source 442, a variable delay circuit 446, and a load fluctuation compensation circuit 30. The variable delay circuit 446 delays each pulse of a reference clock supplied from outside, by a corresponding desired delay amount, thereby generating a timing signal.

The power source 442 supplies a power source voltage for driving the variable delay circuit 446, to the variable delay circuit 446. The load fluctuation compensation circuit 30 is provided in parallel with the variable delay circuit 446 in the vicinity of the variable delay circuit 446, and compensates the power source voltage supplied to the variable delay circuit 446. The load fluctuation compensation circuit 30 has the same configuration as the load fluctuation compensation circuit 30 explained with reference to FIG. 1 through FIG. 9, and has the similar function thereto. Although the load fluctuation compensation circuit 30 explained with reference to FIG. 1 though FIG. 9 compensates the power source voltage supplied to the operation circuit 16, the load fluctuation compensation circuit 30 in the present example compensates the power source voltage supplied to the variable delay circuit 446. The other functions in the present example are the same as the functions of the load fluctuation compensation circuit 30 explained with reference to FIG. 1 through FIG. 9.

The timing generator circuit 440 in the present example enables to restrict the load fluctuation in the power source 442, by restraining the fluctuation of the compensation power current for the entire circuit. Thus, the delay error of the variable delay circuit 446 attributable to the load fluctuation is reduced, thereby enabling to generate a timing signal the phase of which is accurately controlled.

Moreover, the test apparatus 400 employing the timing generator circuit 440 is able to generate a test signal the phase of which is accurately controlled, and so can test the device under test 300 accurately.

In the above, the present invention has been described by way of an exemplary embodiment. However, it is needless to say that the technical scope of the present invention should not be limited by the above-described embodiment. It should be understood that those skilled in the art might make many modifications and improvements to the above-described embodiment. It is obvious from the appended claims that embodiments with such modifications or improvements also fall within the technical scope of the present invention.

As clear from the foregoing, an embodiment of the present invention provides a load fluctuation compensation circuit, an electronic device, a test apparatus, and a load fluctuation compensation method by which load fluctuation in an operation circuit can be accurately compensated.

The invention claimed is:

1. A load fluctuation compensation circuit for compensating a power source voltage supplied to an operation circuit, the load fluctuation compensation circuit comprising:
a periodic signal changing section that receives a power source voltage from a power source shared with the operation circuit, and outputs a changed signal resulting from changing a supplied periodic signal according to the power source voltage;
a phase comparator that compares a phase of the periodic signal with a phase of the changed signal outputted from the periodic signal changing section;
an initializing section that generates a bias voltage supplied to the periodic signal changing section and adjusts a phase difference between the periodic signal and the changed signal to a preset value, based on the comparison result of the phase comparator;
a controller that holds the bias voltage outputted from the initializing section when the phase difference between the periodic signal and the changed signal has become the preset value;
a power current consumption circuit that shares a power source with the operation circuit; and
a fluctuation compensation section that controls an amount of a power current supplied to the power current consumption circuit, based on the comparison result outputted from the phase comparator while the bias voltage of the initializing section is kept on hold.

2. The load fluctuation compensation circuit according to claim 1, wherein
the periodic signal changing section includes a delay circuit, and outputs a delayed signal resulting from delaying the periodic signal by a delay amount corresponding to the power source voltage.

3. The load fluctuation compensation circuit according to claim 2, wherein
the phase comparator outputs the comparison result that represents which of the phases of the periodic signal and the delayed signal is ahead of the other, and
the initializing section includes:
a first counter that outputs a first counter value that is incremented or decremented according to the comparison result; and
a DA converter that outputs the bias voltage having a level corresponding to the first counter value.

4. The load fluctuation compensation circuit according to claim 2, further comprising:
a PVT monitor circuit formed on a same substrate on which the operation circuit is formed, the PVT monitor circuit formed in a same process in which the delay circuit is formed, and a characteristic of the PVT monitor circuit fluctuating according to a fluctuation of at least one of the process for the delay circuit, the power source voltage of the delay circuit, and a temperature of the delay circuit; and
a setting section that measures the characteristic of the PVT monitor circuit, and sets a resolution of the DA converter based on the measurement result.

5. The load fluctuation compensation circuit according to claim 4, wherein
the setting section further sets an initial value of the first counter value outputted from the first counter, based on the measurement result.

6. The load fluctuation compensation circuit according to claim 5, wherein
the setting section stores, in advance, a table representing the resolution of the DA converter and the initial value of the first counter value, which are to be set to each measurement result of the PVT monitor circuit.

7. The load fluctuation compensation circuit according to claim 6, wherein
the fluctuation compensation section includes:
a second counter that outputs a second counter value that is incremented or decremented according to the comparison result; and
a power current source that generates a power current according to the second counter value, and supplies the generated power current to the power current consumption circuit.

8. The load fluctuation compensation circuit according to claim 7, wherein
the setting section further sets a resolution of the power current source based on the measurement result.

9. The load fluctuation compensation circuit according to claim 8, wherein
the setting section stores, in advance, a table representing the resolution of the power current source to be set to each measurement result concerning the characteristic of the PVT monitor circuit.

10. The load fluctuation compensation circuit according to claim 7, wherein
when the phase difference between the periodic signal and the delayed signal is not the preset value, the controller supplies an operation clock to the first counter and stops supply of an operation clock to the second counter, and
when the phase difference between the periodic signal and the delayed signal has become the preset value, the controller stops the supply of an operation clock to the first counter and starts supplying an operation clock to the second counter.

11. The load fluctuation compensation circuit according to claim 1, wherein
the periodic signal changing section includes an oscillator circuit, and outputs an oscillation signal resulting from converting the periodic signal into a frequency corresponding to the power source voltage.

12. The load fluctuation compensation circuit according to claim 11, further comprising:
a pulse generator that outputs a pulse of a preset pulse width according to either a leading edge or a trailing edge of the periodic signal, wherein
each time the pulse is received from the pulse generator, the oscillator circuit stops oscillation according to the pulse, and starts new oscillation according to the pulse.

13. An electronic device having an operation circuit, the electronic device comprising:
a source power supply line via which a source power is supplied to the operation circuit; and
a load fluctuation compensation circuit for compensating a power source voltage supplied to the operation circuit via the source power supply line, wherein
the load fluctuation compensation circuit includes:
a periodic signal changing section that receives a power source voltage from a power source shared with the operation circuit, and outputs a changed signal resulting from changing a supplied periodic signal according to the power source voltage;

a phase comparator that compares a phase of the periodic signal with a phase of the changed signal outputted from the periodic signal changing section;

an initializing section that generates a bias voltage supplied to the periodic signal changing section and adjusts a phase difference between the periodic signal and the changed signal to a preset value, based on the comparison result of the phase comparator;

a controller that holds the bias voltage outputted from the initializing section when the phase difference between the periodic signal and the changed signal has become the preset value;

a power current consumption circuit that shares a power source with the operation circuit; and a fluctuation compensation section that controls an amount of a power current supplied to the power current consumption circuit, based on the comparison result outputted from the phase comparator while the bias voltage of the initializing section is kept on hold.

14. The electronic device according to claim 13, wherein the periodic signal changing section includes a delay circuit, and outputs a delayed signal resulting from delaying the periodic signal by a delay amount corresponding to the power source voltage.

15. The electronic device according to claim 13, wherein the periodic signal changing section includes an oscillator circuit, and outputs an oscillation signal resulting from converting the periodic signal into a frequency corresponding to the power source voltage.

16. A test apparatus for testing a device under test, the test apparatus comprising:

a pattern generator that generates a test pattern for testing the device under test;

a waveform shaping section that generates a test signal to be supplied to the device under test, based on the test pattern;

a timing generator circuit that generates a timing signal for specifying a phase of the test signal, and supplies the generated timing signal to the waveform shaping section; and a determining section that determines whether the device under test is defective or not, based on an output signal from the device under test, wherein the timing generator circuit includes:

a variable delay circuit that generates the timing signal by delaying each pulse of a supplied reference clock;

a power source that supplies a power source voltage for driving the variable delay circuit, to the variable delay circuit; and a load fluctuation compensation circuit that compensates the power source voltage supplied to the variable delay circuit, and the load fluctuation compensation circuit includes:

a periodic signal changing section that receives a power source voltage from a power source shared with the operation circuit, and outputs a changed signal resulting from changing a supplied periodic signal according to the power source voltage;

a phase comparator that compares a phase of the periodic signal with a phase of the changed signal outputted from the periodic signal changing section;

an initializing section that generates a bias voltage supplied to the periodic signal changing section and adjusts a phase difference between the periodic signal and the changed signal to a preset value, based on the comparison result of the phase comparator;

a controller that holds the bias voltage outputted from the initializing section when the phase difference between the periodic signal and the changed signal has become the preset value;

a power current consumption circuit that shares a power source with the operation circuit; and a fluctuation compensation section that controls an amount of a power current supplied to the power current consumption circuit, based on the comparison result outputted from the phase comparator while the bias voltage of the initializing section is kept on hold.

17. The test apparatus according to claim 16, wherein the periodic signal changing section includes a delay circuit, and outputs a delayed signal resulting from delaying the periodic signal by a delay amount corresponding to the power source voltage.

18. The test apparatus according to claim 16, wherein, the periodic signal changing section includes an oscillator circuit, and outputs an oscillation signal resulting from converting the periodic signal into a frequency corresponding to the power source voltage.

19. A load fluctuation compensation method for compensating a fluctuation of a power source voltage supplied to an operation circuit by using a periodic signal changing section and a power current consumption circuit, where the periodic signal changing section receives a power source voltage from a power source shared with the operation circuit, and outputs a changed signal resulting from changing a supplied periodic signal according to the power source voltage, and the power current consumption circuit shares a power source with the operation circuit, the load fluctuation compensation method comprising:

initializing to generate a bias voltage supplied to the periodic signal changing section and adjust a changed amount in the periodic signal changing section to a preset value, based on a result of comparing a phase of the periodic signal with a phase of the changed signal outputted from the periodic signal changing section; and controlling a power current consumed by the power current consumption circuit, based on a fluctuation of the changed amount in the periodic signal changing section caused after the adjustment of the changed amount in the periodic signal changing section.

20. The load fluctuation compensation method according to claim 19, wherein the periodic signal changing section includes a delay circuit, and outputs a delayed signal resulting from delaying the periodic signal by a delay amount corresponding to the power source voltage, in the initializing, a bias voltage supplied to the delay circuit is generated and a delay amount in the delay circuit is adjusted to a preset value, based on a result of comparing a phase of the periodic signal with a phase of the delayed signal, and in the controlling, a power current consumed by the power current consumption circuit is controlled, based on a fluctuation of the delay amount in the delay circuit caused after the adjustment of the delay amount in the delay circuit.

21. The load fluctuation compensation method according to claim 19,
   the periodic signal changing section includes an oscillator circuit, and outputs an oscillation signal resulting from converting the periodic signal into a frequency corresponding to the power source voltage,
   in the initializing, a bias voltage supplied to the oscillator circuit is generated and an oscillation frequency in the oscillator circuit is adjusted to a preset value, based on a result of comparing a phase of a supplied periodic signal with a phase of the oscillation signal, and
   in the controlling, a power current consumed by the power current consumption circuit is controlled, based on a fluctuation of the oscillation frequency in the oscillator circuit caused after the adjustment of the oscillation frequency in the oscillator circuit.

* * * * *